(12) United States Patent
Yoshida

(10) Patent No.: US 7,586,194 B2
(45) Date of Patent: Sep. 8, 2009

(54) SEMICONDUCTOR DEVICE HAVING EXPOSED HEAT DISSIPATING METAL PLATE

(75) Inventor: Tomohiro Yoshida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/315,488

(22) Filed: Dec. 23, 2005

(65) Prior Publication Data
US 2006/0138654 A1    Jun. 29, 2006

(30) Foreign Application Priority Data
Dec. 24, 2004   (JP) ............... 2004-373405

(51) Int. Cl.
*H01L 21/06*   (2006.01)
*H01L 21/00*   (2006.01)

(52) U.S. Cl. .............. 257/729; 257/782; 438/121; 438/622

(58) Field of Classification Search ............ None
See application file for complete search history.

(56) References Cited

U.S. PATENT DOCUMENTS 5,656,857 A * 8/1997 Kishita ............... 257/690
5,703,397 A * 12/1997 Endo et al. ........... 257/701
6,621,162 B1 * 9/2003 Ishida et al. .......... 257/728
2001/0017221 A1 * 8/2001 Horiuchi et al. ....... 174/260

FOREIGN PATENT DOCUMENTS

JP   2000-349088   12/2000
JP   2005-116518    4/2005

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

A semiconductor device including; a bottom plate having a laminated structure in which between a first and a second metal plates a third metal plate harder than these metal plates is clipped, a concave portion formed by removing a part of the first metal plate laminated on the surface of the bottom plate and the third metal plate laminated there under and expose the second metal plate, a semiconductor element arranged in the concave portion H, circuit board connected with the semiconductor element arranged on the surface of the bottom plate, circuit boards arranged on the surface of the bottom plate, a sidewall made of metal and fixed on the bottom plate surrounding the circuit boards and the semiconductor element, a metal lead provided so as to penetrate the side wall through an insulator, and a lid made of metal provided to block an opening formed by the sidewall.

16 Claims, 3 Drawing Sheets

SEMICONDUCTOR DEVICE HAVING EXPOSED HEAT DISSIPATING METAL PLATE

CROSS-REFERENCE TO RELATED APPLICATIONS

This application is based upon and claims the benefit of priority from the prior Japanese Patent Application No. 2004-373405, filed on Dec. 24, 2004, the entire contents of which are incorporated herein by reference.

BACKGROUND TECHNOLOGY OF THE INVENTION

The present invention relates to a semiconductor device, which has improved a heat dissipation property of a package for containing semiconductor dies.

Semiconductor devices used in microwave frequency is so constructed that, for example, semiconductor dies for amplifying radio frequency signals and various circuit boards connected with the semi-conductor dies are arranged in a package. A package is composed of, a bottom plate for fixing semiconductor dies and circuit boards, a side wall provided on the periphery of the bottom plate so as to surround the semiconductor dies and circuit boards, and a lid for covering upper opening formed by the side wall.

By the way, usually a plurality of power amplifying semiconductor dies is used in a semiconductor device for power use. Therefore, a high mechanical strength is required for a package for power use and the size becomes large because a plurality of semiconductor dies and circuit boards to be connected with them should be contained therein.

Further, packages used for semiconductor device for power use, need to discharge heat generated by semiconductor dies. For this reason, such metal having high heat conductivity and relatively low price as copper is generally used. However, copper is soft and ductile, and packages having enough mechanical strength for power use cannot be obtained.

Therefore material having a so called Copper-Molybdenum-Copper structure is used, in which molybdenum or tungsten plate harder than copper is interposed between two copper plates as support metal, to improve mechanical strength in a package for power use with high heat generation. Hereinafter, material having such structure is called as a CMC structure.

Here, a conventional semiconductor device using a CMC structure package is explained referring to FIG. 1A and FIG. 1B. FIG. 1A is a top view showing the package with its lid removed and FIG. 1B is a cross section showing a section along the line b-b in FIG. 1A seen along an arrow direction. In FIG. 1A and FIG. 1B, the corresponding parts are assigned with same symbols.

A package 32 is mounted on a metal plate 31. The package 32 is composed of a bottom plate 32a, a sidewall 32b, and a lid (not illustrated) for covering the opening at the upper portion of the sidewall 32b. The bottom plate 32a has the CMC structure, formed in a rectangular-shape as a whole, for example. Namely, the bottom plate 32a has a laminated structure, in which a metal plate M harder than copper is interposed between two copper plates C1 and C2 as shown in FIG. 1B. The metal plate M is, for example, molybdenum Mo or tungsten W. On opposing edges of the bottom plate 32a, two screw holes 33 for fixing the package 32 on the plate 31 by screw are provided respectively.

A sidewall 32b is provided on the bottom plate 32a. The major portion of the sidewall 32b is made of metal and is formed as a whole rectangular frame in shape. At center portions of two opposing sides of the sidewall 32b, an input metal lead 34a and an output metal lead 34b are provided, which penetrates through the sidewall 32b. At portions surrounding the metal lead 34a, 34b, insulator 35a, 35b such as ceramic member are provided in order to prevent the metal lead 34a, 34b from contacting with the metal portion of the sidewall 32b. One end of the metal lead 34a, 34b projects inside the sidewall 32b and the insulator 35a, 35b are provided under the projection portion a1, b1.

A semiconductor element 36 for microwave power amplification is mounted on a central portion of the bottom plate 32a surrounded by the sidewall 32b. The semiconductor element 36 for microwave power amplification contains, for example, four semiconductor dies 36a to 36d. On the input metal lead 34a side of the bottom plate 32a, a power divider circuit 37 including an input matching circuit formed on the surface of the dielectric plate is located. On the output metal lead 34b side of the bottom plate 32a, a power combiner circuit 38 including an output matching circuit is located. The semiconductor dies 36a to 36d are electrically connected with the power divider circuit 37 and with the power combiner circuit 38 by wires W. Also, the input metal lead 34a is electrically connected with the power divider circuit 37 and the power combiner circuit is electrically connected with the output metal circuit 34b by wires W.

In the device thus constructed, a radio frequency big power signal is supplied through the input metal lead 34a, for example. The radio frequency signal is divided into four by the power divider circuit 37 and each of divided t signal is amplified in its power by semiconductor dies 36a to 36d. Then, the divided signals were combined by the power combiner circuit 38 and outputted through the output metal lead 34b.

When amplifying a radio frequency signal having a large power, heat is generated from the semiconductor 36a to 36d. A part of heat generated is dissipated through the bottom plate 32a from the lower surface to the metal plate 31 below. At this time, heat is dissipated through the junction of the bottom plate 32a and the metal plate 31 from the lower surface of the bottom plate 32a to the metal plate 31 with a spread angle of more than 45°. Further, a part of the heat generated in the semiconductor dies 36a to 36d is radiated from the upper surface of the semiconductor dies 36a to 36d upward in the figure by a black body radiation. Here, major portion of the dissipated heat is a downward radiation. The semiconductor device containing semiconductor element and associated circuits in a package as mentioned above is disclosed in Japanese published patent application 2001-257234.

In the conventional semiconductor device, the thermal expansion coefficient of the package becomes higher than that of the dielectric plate such as a ceramic plate, on which a power divider circuit or the power combiner circuit is formed, if the package is formed with copper itself. Therefore, the ceramic plate may have a crack by thermal shrinkage afterwards, if the power divider circuit or the power combiner circuit is soldered on the bottom plate of the package.

On the other hand, the crack generated in the ceramic plate can be avoided, if the bottom plate of the package is formed as a CMC structure material, because a heat expansion coefficient of molybdenum is close to that of the ceramic plate composing the power divider circuit or the power combiner circuit. However, heat dissipation ability is decreased because thermal conductivity of molybdenum is as low as about 40% of that of copper and the heat conductivity of the bottom plate including the junction of molybdenum and copper is less than a half of that of copper.

SUMMARY OF THE INVENTION

According to one aspect of the present invention, a semiconductor device is provided including a bottom plate having a first, a second and a third metal plates formed in a laminated structure, in which the third metal plate is harder than the first and the second metal plate and is interposed between a first and a second metal plates, a concave portion formed so as to expose the second metal plate laminated on the bottom plate by removing a part of the first metal plate and the third metal plate laminated on the second metal plate, a semiconductor element provided in the concave portion, a circuit board connected with the semiconductor element and arranged on the surface of the bottom plate, a metallic side wall fixed on the bottom plate surrounding the circuit board and the semiconductor element, a metal lead, which penetrates the side wall through an insulator, and a metallic lid, which closes an opening formed by the side wall.

DETAILED DESCRIPTION OF THE INVENTION

Figure 1A:
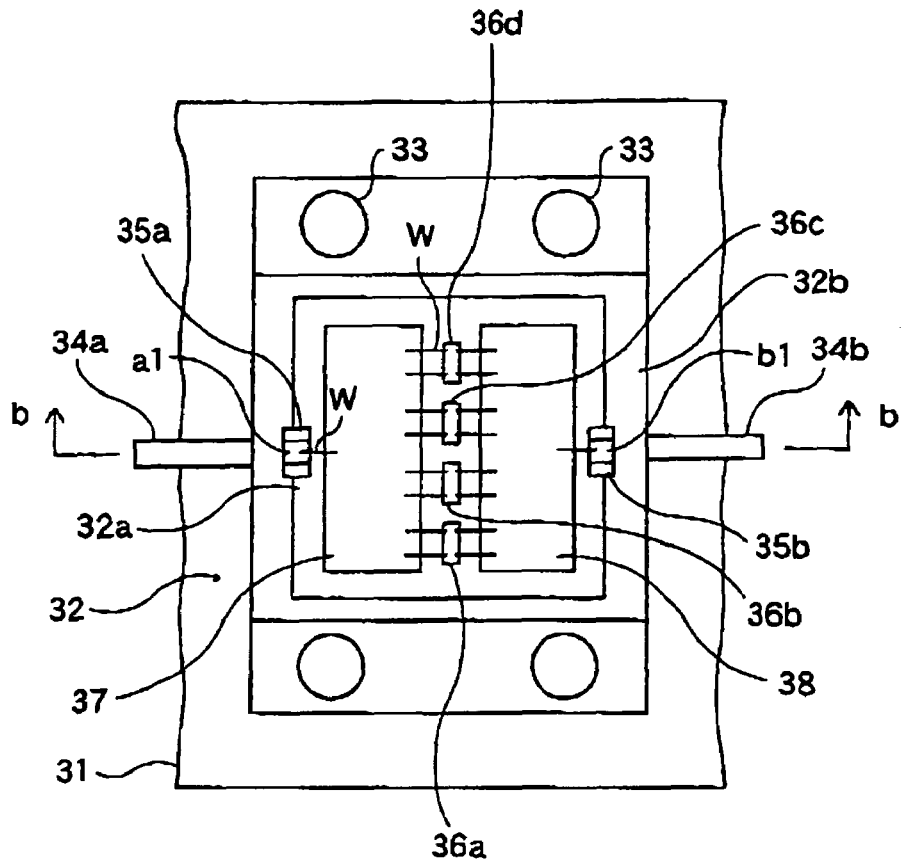
FIG. 1A is a plan view showing a structure of the conventional semiconductor device.
Figure 1B:
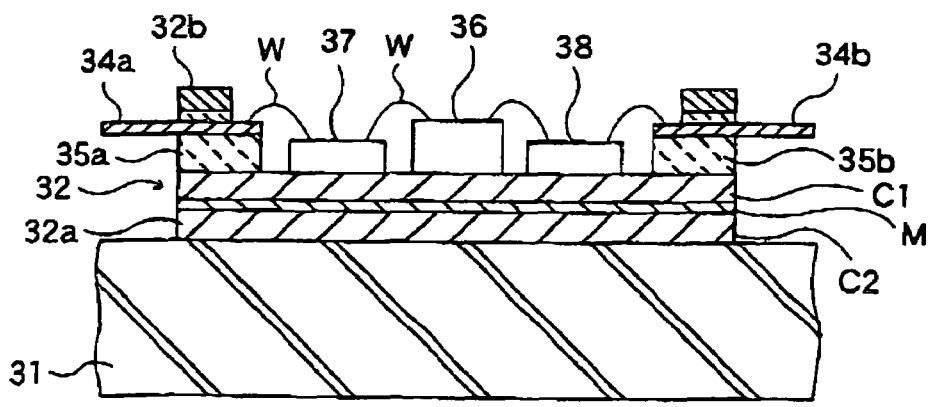
FIG. 1B is a cross section along the line b-b in FIG. 1A.
Figure 2A:
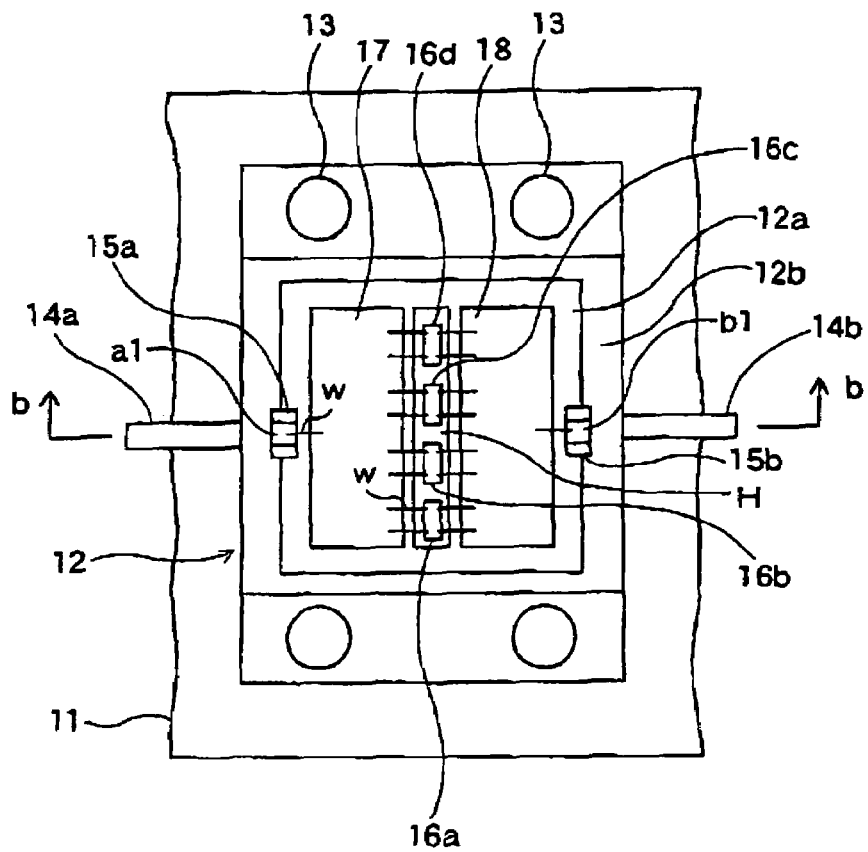
FIG. 2A is a plan view showing a semiconductor device according to an embodiment of the present invention.
Figure 2B:
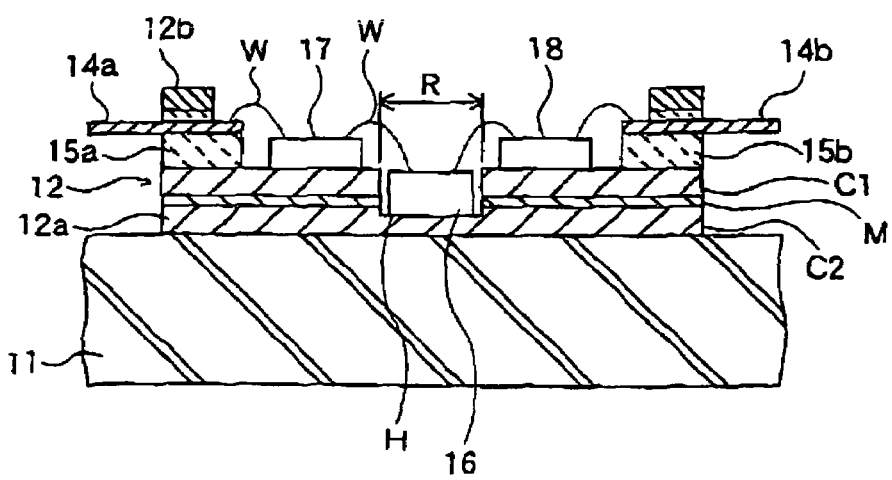
FIG. 2B is a cross section along the line b-b in FIG. 2A.

A semiconductor device according to a first embodiment of the present invention will be explained referring to FIG. 2A and FIG. 2B. FIG. 2A is a plan view showing a semiconductor device, in which a package is shown with a lid eliminated and FIG. 2B is a cross section along by a line b-b in FIG. 2A. Here, the same symbols are assigned to corresponding parts shown in FIG. 2A and FIG. 2B.

A package 12 is fixed on a plate 11 formed with a metal material such as aluminum (Al) etc. The package 12 is composed of a bottom plate 12a, a side wall 12b, and a lid (not illustrated) for covering an opening formed by the side wall 12b. The bottom plate 12a has a laminated structure in which a support metal plate M harder than copper is interposed between two copper plates C1 and C2 as shown in FIG. 2B. The support metal plate M is molybdenum Mo or tungsten W, for example. The bottom plate 12a is about 1 mm thick, for example. The copper plate C1 and C2 and the support metal plate M have a substantially same thickness.

A concave portion H is formed at nearly central portion of the bottom plate 12a surrounded by the side wall 12b, which is formed downward from the surface of the bottom plate 12a. The concave portion H has a depth that the bottom portion is formed at the same level as or lower than the level of the support metal plate M. That is, an area R is formed in a part of the bottom plate, where the upper copper plate C1 and the support metal plate M are removed and the lower copper plate C2 is exposed. Here, it is desirable that if a portion of the lower copper plate C2 is removed, it is as slight as possible. If the surface of the copper plate C2 is removed too much, it may affect the mechanical strength of the bottom plate 12a, wherein a twist may occur on the bottom plate 12a by a heat cycle.

On each of a pair of opposing edge portions of the bottom plate 12a extending out of the side wall 12b, two screw holes 13 are provided for fixing the package 12 on the plate 11 by screws.

The side wall 12b is provided on the bottom plate 12a. The major portion of the side wall 12b is made of metal, which is formed in a rectangular frame shape as a whole. On a central portion of each of a pair of opposing sides of the side wall 12b, an input metal lead 14a and an output metal lead 14b are respectively provided, which penetrates through the side wall 12b. On the penetrating portion of the metal lead 14a and 14b, insulators 15a and 15b made of ceramic and the like are provided around the metal lead 14a and 14b. One end portion of the metal lead 14a and 14b are protruding inside the side wall 12b and insulators 15a and 15b made of the ceramic are also provided under the protruding portion a1, b1, to form a micro strip line.

Semiconductor element 16, which is composed of four GaAs semiconductor dies 16a to 16d for micro wave power amplification, for example, are mounted in the concave portion H formed on the bottom plate 12a. Semiconductor dies 16a to 16d are mounted on the lower copper plate C2 exposed by removing the upper copper plate C1 and the support metal plate M in the concave portion H by soldering or other suitable methods.

A power divider circuit 17 including an input matching circuit formed on the surface of the dielectric plate is provided on the bottom plate 12a on the input metal lead 14a side of the semiconductor dies 16a to 16d. Similarly a power combiner circuit 18 including an output matching circuit formed on the dielectric plate is provided on the bottom plate 12a on the output metal lead 14b side of the semiconductor dies 16a to 16d. The semiconductor dies 16a to 16d are electrically connected with the power divider circuit 17 by wires W. The semiconductor dies 16a to 16d are electrically connected with and the power combiner circuit 18 by wires W. The power divider circuit 17 is electrically connected with the input metal lead 14a by a wire W. The power combiner circuit 18 is electrically connected with the output metal lead 14b by a wire W.

In the semiconductor device described above, a radio frequency (hereinafter referred as RF) signal of high power, for example, is supplied to the input metal lead 14a. The RF signal is divided into four signals by the power divider circuit 17 and each of the signals is amplified by the semiconductor dies 16a to 16d, respectively. The signals amplified by the semiconductor dies are combined by the power combiner circuit 18 and are outputted through the output metal lead.

When the RF signal is amplified to a high power signal by the semiconductor dies 16a to 16d, heat is generated in the operating layer inside the semiconductor dies during their operation. A part of the heat generated in the semiconductor dies 16a to 16d is transmitted through the bottom plate 12a and radiated downward of the figure from its lower surface. A part of the heat generated in the semiconductor dies 16a to 16d is also radiated upward by black body radiation.

According to the embodiment described above, an excellent heat dissipation property is obtained because the bottom plate 12a forming the package is made of a material with CMC structure. That is, the semiconductor dies 16a to 16d are mounted in the concave portion H provided on the bottom plate 12a, where the lower side copper plate C2 is exposed. Therefore, the heat generated in the semiconductor dies 16a to 16d is transported rapidly from the lower side copper plate C2 to the plate 11 without being blocked by the support metal M. Thus, excellent heat dissipation property is obtained.

The heat dissipation property is also improved by locating the semiconductor element in the concave portion H, because the semiconductor dies 16a to 16d are close to the plate 11.

Here, the mechanical strength is not degraded even if a part of the support metal M is removed because the concave portion H formed on the bottom plate 12a has a small area compared with a total area of the bottom plate 12a. Thus, a package with a sufficient mechanical strength for practical use can be obtained.

Further, the semiconductor dies 16a to 16d does not have an adverse effect such as having cracks on the GaAs semiconductor substrate, because thermal expansion coefficient of the GaAs semiconductor substrate is relatively close to that of the copper plate C2 on the lower side.

Figure 3:
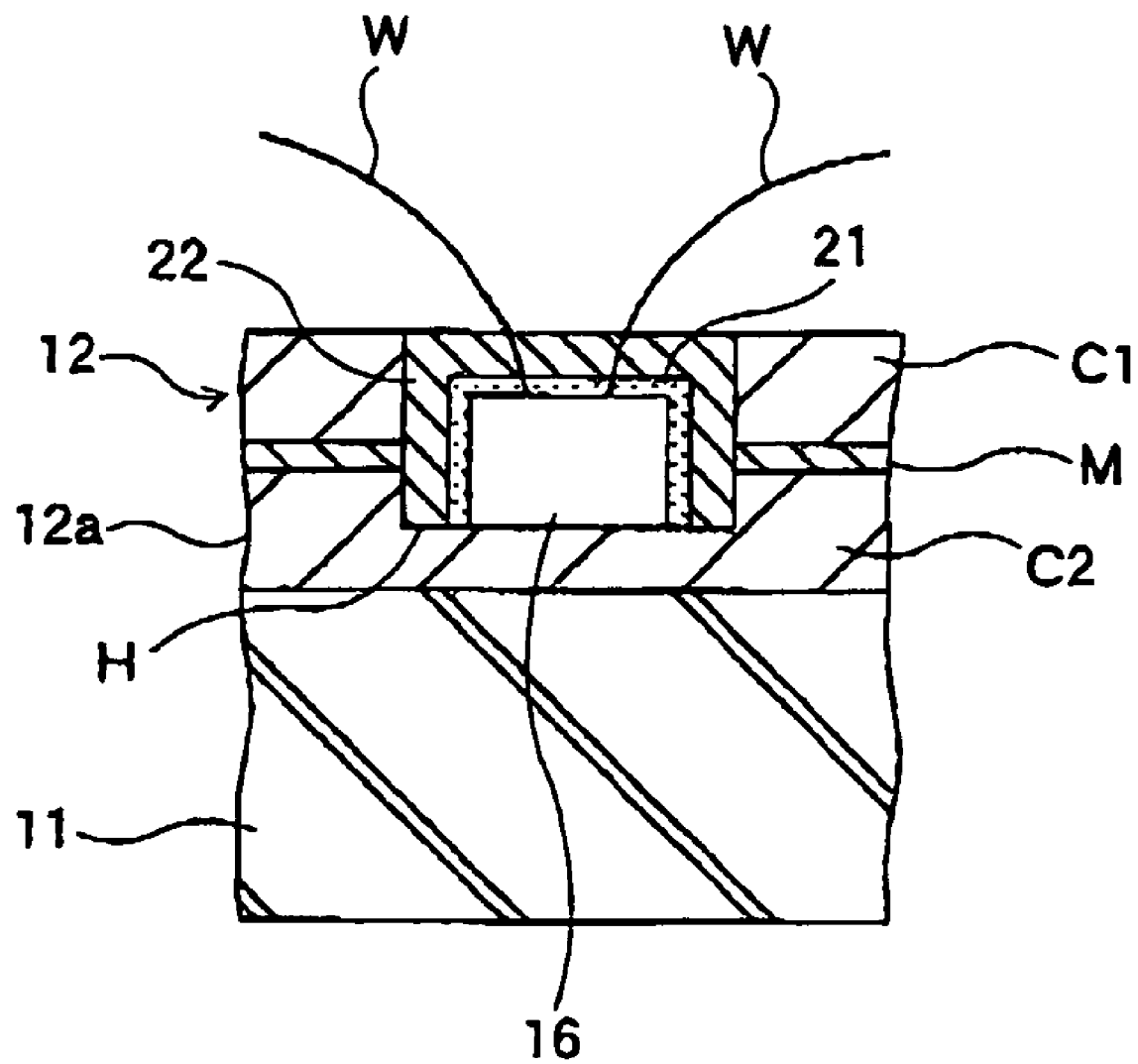
FIG. 3 is a partial cross sectional view for explaining another embodiment according to the present invention.

Next, another embodiment according to the present invention will be explained referring to FIG. 3, which is a cross section showing a part of the semiconductor device. In FIG. 3, the same symbols are assigned to the parts corresponding to those shown in FIG. 2A and FIG. 2B and a duplicating explanation is omitted.

The outer surface of the semiconductor dies 16a to 16d mounted in the concave portion H is covered with a heat-resistant insulator material 21 such as polyimide. Then, a gap formed by a periphery of the semiconductor element 16 and an inner wall of the concave portion H is filled with metal 22 such as Sn—Pb solder alloy. In more detail, polyimide resin is solved in such an organic solvent as thinner and is filled in the concave portion H until the semiconductor element 16 sinks in the solvent. Drying the organic solvent, a film is formed around the semiconductor element 16 having a thickness of nearly about 10 μm. The molten Sn—Pb solder alloy, which is then poured into the concave portion H, is cooled and the solidified metal thus fills the space formed in the concave portion H. Here, the wire W, which connects the semiconductor dies 16a to 16d with the power divider circuit 17 on the input side and with the power combiner circuit 18 on the output side, is also coated with a heat-resistant material such as polyimide resin. Thus, an electrical short circuit is prevented from occurring otherwise caused by a metal 22 filled on the semiconductor element 16.

According to the embodiment, far better heat dissipation is realized compared with the embodiment described referring to FIG. 2A and FIG. 2B, in which the space in the concave portion H is filled with air, because the heat generated inside the semiconductor element 16 is transported not only from the bottom surface of the semiconductor element 16 but also from the whole periphery of the semiconductor element 16 to the bottom plate 12a via the metal 22 filled in the concave portion H.

In the embodiment shown in FIG. 3, the concave portion H is entirely filled with the metal 22. However, the concave portion H is not always necessarily filled entirely. An upper part of the concave portion H may be left unfilled or may be over filled with the metal 22 so that the metal 22 protrudes from the surface of the bottom plate 12a.

In the embodiments mentioned above, a plurality of semiconductor dies, the power divider circuit and the power combiner circuit are arranged in the package. However, the elements are not limited to them, but such passive elements as multilayer capacitor or coil may be arranged. There is no problem in the heat dissipation even if these passive elements are arranged in the region where the support metal M exists, because electricity consumption and accompanying heat generation by them is low.

Further, in the embodiment mentioned above, the three layer CMC structure material is used as a material forming the bottom plate 12a. However, a structure of five or more layers laminated may be used other than the three layer structure, if the structure having a plurality of a first kind of metal plates laminated includes a second kind of metal plate, which is harder than the first kind of metal plates and is sandwiched between the first kind of metal plates.

Further, in the case of three layer CMC structure, sometimes bowing due to heat may arise to degrade flatness, if the thickness of two metals, made of copper for example, having the support metal there between is different. Therefore, it is preferable that the thickness of the two metals having the support metal there between is equal.

The invention claimed is:

1. A semiconductor device comprising:
    a bottom plate having a first, a second and a third metal plates formed in a laminated structure, in which the third metal plate has higher mechanical strength and lower heat conductivity than the first and the second metal plates and is interposed between the first and a second metal plates;
    a concave portion formed so as to expose the second metal plate by removing a part of the first metal plate and the third metal plate;
    a semiconductor element provided in the concave portion;
    a metallic side wall fixed on the bottom plate surrounding the semiconductor element; and
    a metal lead, which penetrates the side wall through an insulator, wherein
    a portion of the second metal plate is removed in the concave portion.

2. A semiconductor device according to claim 1, wherein the first and the second metal plates are copper (Cu), the third metal plate is molybdenum (Mo) or tungsten (W).

3. A semiconductor device according to claim 1, wherein the semiconductor element is a semiconductor element for power amplification.

4. A semiconductor device according to claim 1, wherein the semiconductor device is a GaAs semiconductor device.

5. A semiconductor device according to claim 1, wherein each of the first and the second metal plates forming the bottom plate have a nearly equal thickness.

6. A semiconductor device according to claim 1, further comprising:
    a heat-resistant insulator film for coating the surface of the semiconductor element provided in the concave portion formed on the bottom plate; and
    metal filled inside the concave portion through the heat-resistant insulator film.

7. A semiconductor device according to claim 6, further comprising:
    a wire coated with heat-resistant insulator, which is lead out of a surface of the bottom plate through the heat-resistant insulator film and the metal filled inside the concave portion.

8. A semiconductor device according to claim 6, wherein the metal filled inside the concave portion is a solder alloy.

9. A semiconductor device according to claim 1, further comprising
    a plurality of semiconductor dies mounted in the concave portion formed in the bottom plate;
    a power divider circuit including an input matching circuit provided on the bottom plate on the input side of the semiconductor dies; and
    a power combiner circuit including an output matching circuit provided on the bottom plate on the output side of the semiconductor dies, wherein
    the metal lead is comprising an input metal lead connected with the input matching circuit and an output metal lead connected with the output matching circuit.

10. A semiconductor device according to claim 9, wherein the first and the second metal plates are copper (Cu), the third metal plate is molybdenum (Mo) or tungsten (W).

11. A semiconductor device according to claim 9, wherein the semiconductor element is a semiconductor element for power amplification.

12. A semiconductor device according to claim 9, wherein the semiconductor device is a GaAs semiconductor device for power amplification.

13. A semiconductor device according to claim 9, wherein each of the first and the second metal plates forming the bottom plate have a nearly equal thickness.

14. A semiconductor device according to claim 9, further comprising:
   a heat-resistant insulator film for coating the surface of the semiconductor element provided in the concave portion formed on the bottom plate; and
   a metal layer filled inside the concave portion through the heat-resistant insulator film.

15. A semiconductor device according to claim 14, further comprising:
   a wire coated with heat-resistant insulator, which is lead out of a surface of the bottom plate through the heat-resistant insulator film and the metal filled inside the concave portion.

16. A semiconductor device according to claim 14, wherein the metal filled inside the concave portion is a solder alloy.

* * * * *